(12) United States Patent
Lin et al.

(10) Patent No.: US 9,231,168 B2
(45) Date of Patent: Jan. 5, 2016

(54) LIGHT EMITTING DIODE PACKAGE STRUCTURE

(71) Applicant: Industrial Technology Research Institute, Hsinchu (TW)

(72) Inventors: Re-Ching Lin, Taichung (TW); Shih-Yi Wen, Taipei (TW); Chen-Peng Hsu, Hsinchu (TW); Hung-Lieh Hu, Hsinchu (TW); Yu-Chen Yu, Hsinchu County (TW); Chia-Fen Hsieh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/267,919

(22) Filed: May 2, 2014

(65) Prior Publication Data

US 2014/0327025 A1      Nov. 6, 2014

Related U.S. Application Data

(60) Provisional application No. 61/818,889, filed on May 2, 2013.

(30) Foreign Application Priority Data

Jan. 2, 2014   (TW) .............................. 103100061 A

(51) Int. Cl.
*H01L 33/00*   (2010.01)
*H01L 33/50*   (2010.01)

(52) U.S. Cl.
CPC .................................. *H01L 33/501* (2013.01)

(58) Field of Classification Search
CPC ...... H01L 33/501; H01L 33/50; H01L 33/502; H01L 33/504; H01L 33/52
See application file for complete search history.

(56) References Cited

U.S. PATENT DOCUMENTS

| 7,531,960 B2 | 5/2009 | Shimizu et al. |
| 7,935,981 B2 * | 5/2011 | Lee .......................... H01L 33/56 257/100 |

(Continued)

FOREIGN PATENT DOCUMENTS

| CN | 202585514 | 12/2012 |
| EP | 2197053 | 6/2010 |

(Continued)

OTHER PUBLICATIONS

Nishiura et al., "Properties of transparent Ce:YAG ceramic phosphors for white LED," Optical Materials, Mar. 2011, pp. 688-691.

(Continued)

*Primary Examiner* — Victor A Mandala
(74) *Attorney, Agent, or Firm* — Jianq Chyun IP Office

(57) ABSTRACT

A light-emitting diode package structure including a chip carrier portion, a light-emitting diode chip, and a package material is provided. The light-emitting diode chip is disposed on the chip carrier portion of the package. The package material is filled in the chip carrier portion and covers the light-emitting diode chip. The package material includes a matrix material, a plurality of first powder particles, and a plurality of second powder particles. The first powder particles and the second powder particles are distributed in the matrix material. Each first powder particle is a wavelength conversion material. Each second powder particle has a shell-like structure.

18 Claims, 10 Drawing Sheets

(56) References Cited

U.S. PATENT DOCUMENTS

| | | | |
|---|---|---|---|
| 8,084,530 B2 | 12/2011 | Tanikawa et al. | |
| 8,098,005 B2 * | 1/2012 | Kwak | C09K 11/025 |
| | | | 313/503 |
| 8,138,666 B2 | 3/2012 | Harada | |
| 8,390,022 B2 | 3/2013 | Hussell et al. | |
| 8,502,364 B2 | 8/2013 | Kato et al. | |
| 2009/0050911 A1 * | 2/2009 | Chakraborty | H01L 33/56 |
| | | | 257/89 |
| 2011/0068322 A1 | 3/2011 | Pickett et al. | |
| 2011/0101387 A1 | 5/2011 | Kinomoto | |
| 2011/0143627 A1 | 6/2011 | Becker et al. | |
| 2011/0248299 A1 | 10/2011 | Park et al. | |
| 2013/0134460 A1 * | 5/2013 | Watkins | B29D 11/00634 |
| | | | 257/98 |
| 2015/0077966 A1 * | 3/2015 | Bessho | G02B 5/0242 |
| | | | 362/19 |
| 2015/0123153 A1 * | 5/2015 | Setlur | H01L 33/502 |
| | | | 257/98 |

FOREIGN PATENT DOCUMENTS

| | | |
|---|---|---|
| JP | 4530094 | 8/2010 |
| TW | 201226523 | 7/2012 |
| TW | 201245412 | 11/2012 |

OTHER PUBLICATIONS

Wang et al., "Spectral power distribution and quantum yields of a Eu3+-doped heavy metal tellurite glass under the pumping of a violet light emitting diode," Measurement Science and Technology, Mar. 13, 2007, pp. 1348-1352.

Luo et al., "Eu2+-Doped Glass Ceramics Containing BaF2 Nanocrystals as a Potential Blue Phosphor for UV-LED," Journal of the American Ceramic Society, Apr. 2009, pp. 942-944.

Geller et al., "Structure and ferrimagnetism of yttrium and rare-earth-iron garnets," Acta Crystallographica, Mar. 1957, pp. 239.

Chen et al., "CeF3-based glass ceramic: a potential luminescent host for white-light-emitting diode," Optics Letters, Oct. 1, 2009, pp. 2882-2884.

Fujita et al., "Thermal Quenching of Ce3þ:Y3Al5O12 Glass-Ceramic Phosphor," Japanese Journal of Applied Physics, Dec. 7, 2009, pp. 120210.

"Office Action of Taiwan Counterpart Application", issued on Jul. 20, 2015, p. 1-p. 8.

* cited by examiner

LIGHT EMITTING DIODE PACKAGE STRUCTURE

CROSS-REFERENCE TO RELATED APPLICATION

This application claims the priority benefits of U.S. provisional application Ser. No. 61/818,889, filed on May 2, 2013 and Taiwan application serial no. 103100061, filed on Jan. 2, 2014. The entirety of each of the above-mentioned patent applications is hereby incorporated by reference herein and made a part of this specification.

TECHNICAL FIELD

The disclosure relates to a light-emitting diode package structure.

BACKGROUND

Powder particles can provide a variety of functions by controlling the particle size or changing the material thereof. Moreover, powder particles have the characteristic of easy processing, and therefore the applications of powder particles are quite extensive. For instance, common goods such as paint, cosmetic, and detergent all achieve the desired effect with powder particles. Moreover, in the field of electronic products, the application of powder particles is even more extensive. Using a light-emitting diode package structure as an example, the wavelength conversion material used in the light-emitting diode package structure is powder particles.

Specifically, the fabrication method of the light-emitting diode package structure generally includes first disposing a light-emitting diode chip on a dock or a chip carrier portion, and then forming a wavelength conversion layer on the light-emitting diode chip with a method of mold glue injection on the dock. In particular, the wavelength conversion layer mainly uses a colloid material as a carrier to carry the wavelength conversion material of the powder particles so as to facilitate the glue injection step. However, in the glue injection step, the wavelength conversion material of the powder particles is subsided in the colloid material due to gravitational force, such that the wavelength conversion material has a concentration gradient distribution in a direction perpendicular to the light-emitting surface of the chip. As a result, the color temperature of the light-emitting diode package structure cannot be precisely controlled. Similarly, in other applications, the subsidence effect of the powder particles in the matrix material often causes the product to fail to meet desired specifications.

SUMMARY

The disclosure provides a light-emitting diode package structure, wherein a package material thereof is composed of at least two powder particles. The powder particles are not excessively concentrated on the bottom portion in the package material.

The light-emitting diode package structure of the disclosure includes a chip carrier portion, a light-emitting diode chip, and a package material. The light-emitting diode chip is disposed on the chip carrier portion of the package. The package material is filled in the chip carrier portion and covers the light-emitting diode chip. The package material includes a matrix material, a plurality of first powder particles, and a plurality of second powder particles. The first powder particles and the second powder particles are distributed in the matrix material. Each first powder particle is a wavelength conversion material, and each second powder particle has a shell-like structure.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
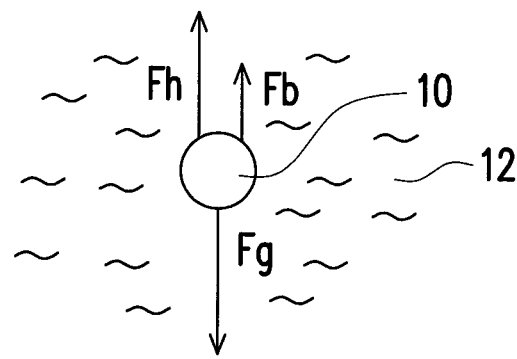
FIG. 1A is a schematic diagram of a powder particle distributed in a matrix material.

FIG. 1A is a schematic diagram of a powder particle distributed in a matrix material. Referring to FIG. 1A, when a powder particle 10 is distributed in a matrix material 12, the forces that the powder particle 10 is subjected to substantially include a gravitational force Fg of the powder particle 10 itself, a buoyancy force Fb of the matrix material 12, and a fluid resistance Fh generated when the powder particle 10 is moved in the matrix material 12. In general, the direction of the gravitational force Fg is opposite to the direction of each of the buoyancy force Fb and the fluid resistance Fh, and the sum of the three forces determines whether the powder particle 10 is sunk or suspended in the matrix material 12. The matrix material 12 can be a fluid material such as silicone oil, or an uncured colloid material such as silica gel, but is not limited thereto.

When the gravitational force Fg of the powder particle 10 is greater than the sum of the buoyancy force Fb and the fluid resistance Fh, the powder particle 10 is subsided and cannot be suspended in the matrix material 12, which is a common issue when the powder particle 10 is used. When the density of the powder particle 10 is greater than the density of the matrix material 12, the issue of subsidence is often not readily overcome. Therefore, in an embodiment of the disclosure below, how the powder particle 10 overcomes the issue of subsidence and the application of the anti-subsidence powder particle are described.

The following descriptions are all embodiments based on the spirit of the disclosure and are not intended to limit the specific means and details of the disclosure.

Figure 1B:
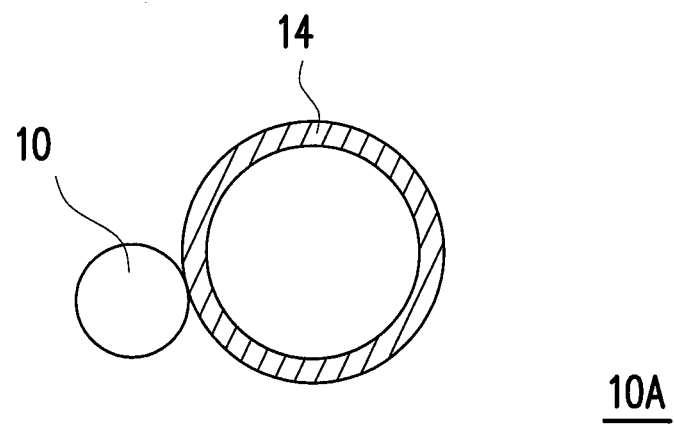
FIG. 1B is a schematic diagram of a composite particle.

If a shell 14 having a low density is connected to the surface of the powder particle 10 as shown in FIG. 1B, then a composite particle 10A is formed, wherein by adjusting the particle size or quantity of the shell 14, the equivalent density of the composite particle 10A can be adjusted. If the density of the powder particle 10 is d1, the weight of the powder particle 10 is m1, and the volume of the powder particle 10 is v1, and the density of the shell 14 is d2, the weight of the shell 14 is m2, and the volume of the shell 14 is v2, then after the powder particle 10 and the shell 14 are bonded to form the composite particle 10A, the equivalent density of the composite particle 10A is d3=(m1+m2)/(v1+v2). In other words, the equivalent density of the composite particle 10A is necessarily less than the density of the powder particle 10. The method is used in the present embodiment to adjust the density of the composite particle so as to achieve the purpose of balancing gravitational force and buoyancy force.

Figure 2:
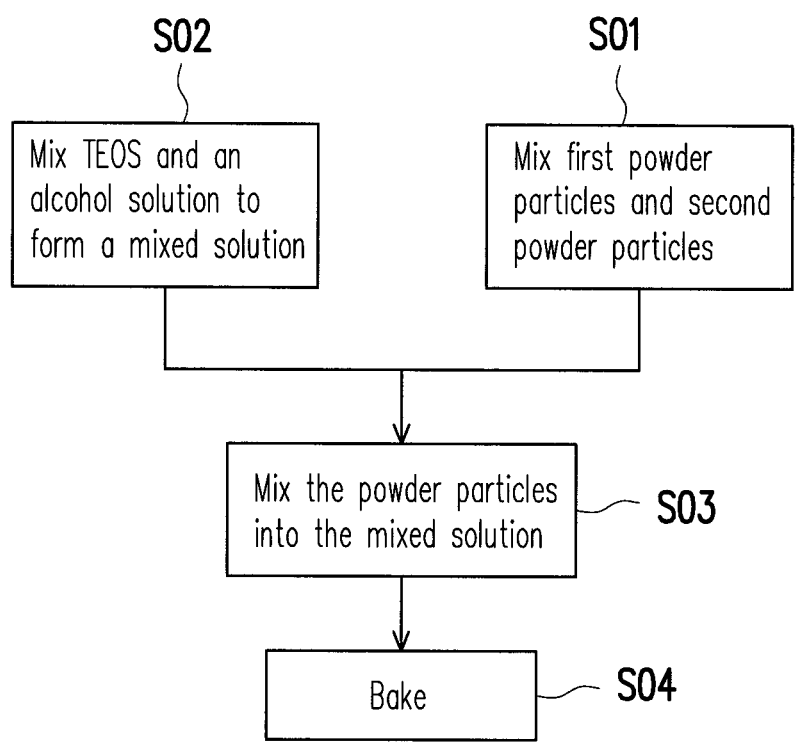
FIG. 2 is a schematic diagram of the process of a preparation method of a composite material according to an embodiment of the disclosure.

FIG. 2 is a schematic diagram of the fabrication process of a composite material, wherein an embodiment of the preparation method of the composite material is as follows:

Step S01: a first power particles and a second powder particles are uniformly mixed;

Step S02: tetraethyl orthosilicate (TEOS) and an alcohol solution are uniformly mixed, wherein the alcohol solution contains water ($H_2O$) and the water can be reacted with TEOS, and the function of the alcohol is to uniformly mix the TEOS in oil phase and the $H_2O$ in water phase. In such a mixing process, the alcohol does not participate in the reaction. Therefore, the reaction formula of the above mixing process is as follows:

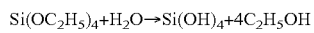

$$Si(OC_2H_5)_4 + H_2O \rightarrow Si(OH)_4 + 4C_2H_5OH$$

Step S03: the mixed powder particles of S01 is mixed into the mixed solution of TEOS and alcohol solution. In this step, TEOS and the alcohol are reacted to produce $Si(OH)_4$ colloids, which are colloids formed by the linking of $Si(OH)_4$. An ammonia solution can further be added such that the reaction of $Si(OH)_4$ to form $SiO_2$ is accelerated, wherein the ammonia solution is a catalyst and does not participate in the reaction. The reaction formula in which the ammonia solution is used as a catalyst can be presented as follows:

$$Si(OH)_4 + Si(OH)_4 \rightarrow NH_4OH \rightarrow SiO_2 + H_2O$$

Step S04: the remaining water ($H_2O$) and the resulting alcohol ($C_2H_5OH$) are removed with high-temperature baking to form a thin film($SiO_2$), wherein the thin film is used to bond the first powder particles and the second powder particles.

Figure 3A:
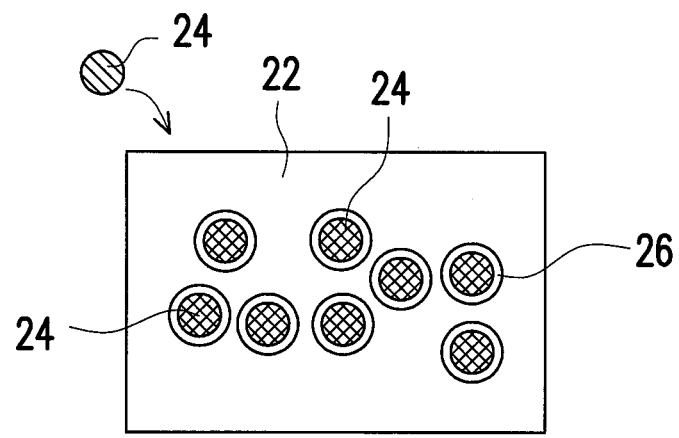
FIG. 3A to FIG. 3B are schematic diagrams of a preparation method of a composite material according to another embodiment of the disclosure.
Figure 3B:
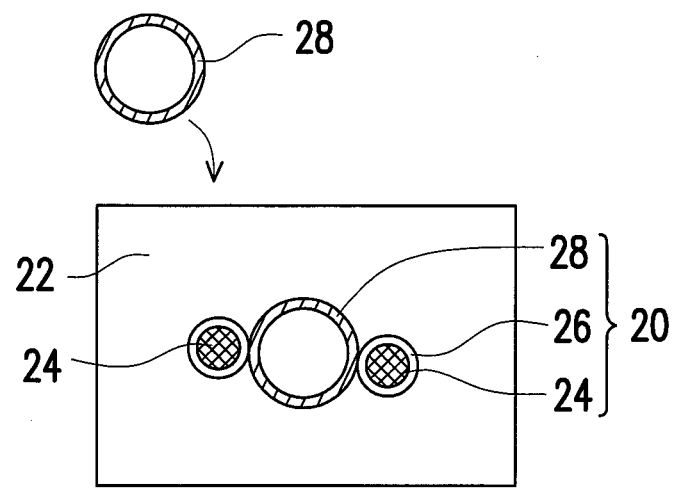

FIG. 3A to FIG. 3B are schematic diagrams of a preparation method of a composite material according to another embodiment of the disclosure. Referring to FIG. 3A, in the preparation method of a composite material provided in the present embodiment, a coupling agent 22 can first be provided, and a plurality of first powder particles 24 are mixed in the coupling agent 22. Here, the coupling agent 22 is TEOS, but can also be sodium silicate ($Na_2SiO_3 \cdot nH_2O$) or the like. The first powder particles 24 can be selected based on actual application requirements, and are, for instance, a wavelength conversion material, a pigment, a dye, or other powder materials. The coupling agent 22 (TEOS) can be mixed with water, butanol, or ethanol, and then the first powder particles 24 are added to the coupling agent 22 mixed with water. The coupling agent 22 forms a laminar colloid on the surface of the first powder particles 24 through a hydrolysis reaction, wherein the laminar colloid formed by the coupling agent 22 is used as a binding agent 26. In the present embodiment, when the coupling agent 22 is TEOS, the binding agent 26 is silicon dioxide, and the ammonia solution catalyst can be added to the hydrolysis reaction of the coupling agent to accelerate the production of silicon dioxide.

Next, referring to FIG. 3B, a second powder particle 28 is added to the mixture of the coupling agent 22 and the first powder particles 24. The second powder particle 28 can be bonded with at least one first powder particle 24 through the binding agent 26 to form a composite particle 20. In the present embodiment, the second powder particle 28 has a shell-like structure, and can be a hollow shell. Here, the shell includes silicon oxide, aluminum oxide, titanium oxide, chromium oxide, or a combination thereof. Moreover, in other embodiments, a core material can be filled inside the shell to form the second powder particle 28, wherein the core material can be magnetic or be driven by an electric field.

Figure 4A:
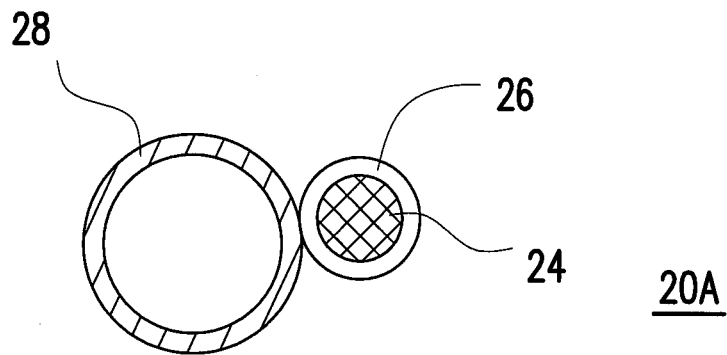
FIG. 4A to FIG. 4C are schematic diagrams of various composite materials.
Figure 4B:
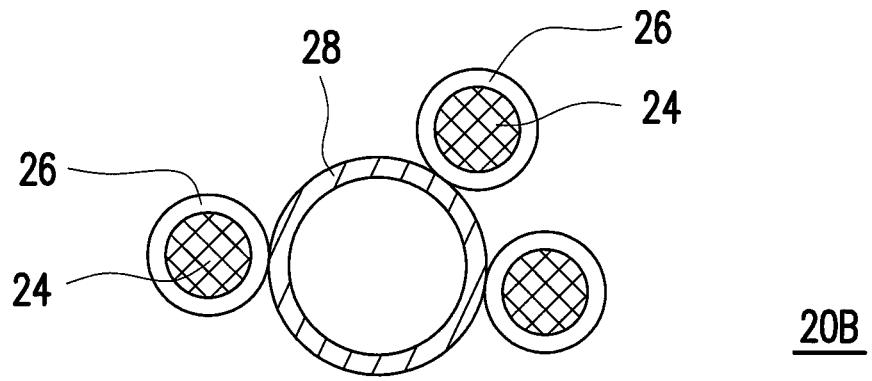
Figure 4C:
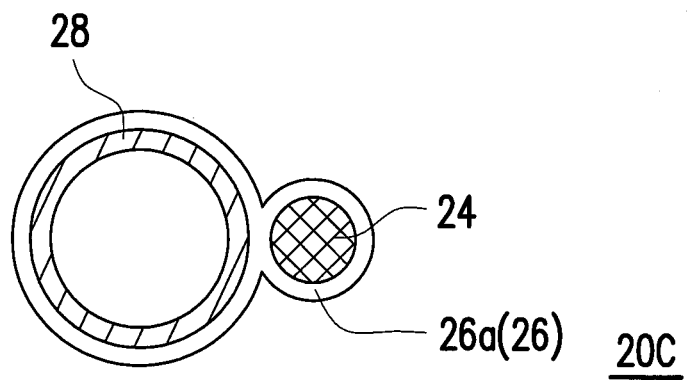

After the composite particle 20 is formed, a baking step is performed to remove the resulting water and alcohol so as to obtain a dried composite particle 20. In the mixing process of FIG. 3B, the first powder particles 24 and the second powder particle 28 can be bonded together through various methods. As a result, the composite particle 20 can have various configurations, wherein FIG. 4A to FIG. 4C are schematic diagrams of several composite particles. In FIG. 4A, a composite particle 20A can be formed by bonding a first powder particle 24 and a second powder particle 28, and the binding agent 26 is used to connect the first powder particle 24 and the second powder particle 28. In FIG. 4B, a composite particle 20B can be formed by bonding a plurality of first powder particles 24 and a second powder particle 28, and the binding agent 26 is used to connect the first powder particles 24 and the second powder particle 28. In FIG. 4C, a composite particle 20C is formed by bonding at least one first powder particle 24 and at least one second powder particle 28, and the binding agent 26 encapsulates the first powder particle 24 and the second powder particle 28 at the same time to form a cover layer 26a of the composite particle 20C. In other words, in addition to being used to connect the first powder particle 24 and the second powder particle 28, the binding agent 26 can also be used to cover the first powder particle 24 and the second powder particle 28 together.

In the present embodiment, the second powder particle 28 has a shell-like structure. The second powder particle 28 is a hollow shell. In the present embodiment, by bonding the second powder particle 28 and the first powder particle 24, the equivalent density of each of composite particles 20, 20A, 20B, and 20C can be less than the density of the first powder particle 24. Therefore, the composite particles 20, 20A, 20B, and 20C of the present embodiment are more readily suspended in a fluid or an uncured matrix with respect to the first powder particle 24, which is beneficial to the application of the composite particles 20, 20A, 20B, and 20C in powder state.

Figure 5:
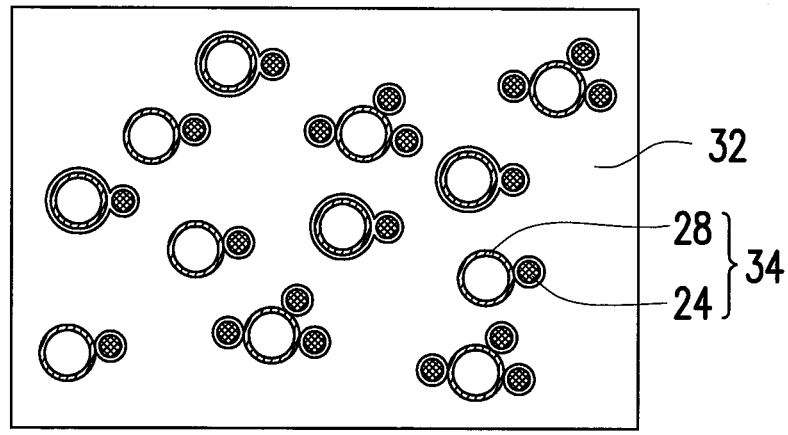
FIG. 5 is a schematic diagram of a composite material according to an embodiment of the disclosure.

FIG. 5 is a schematic diagram of a composite material according to an embodiment of the disclosure. Referring to FIG. 5, a composite material 30 of the present embodiment includes a plurality of composite particles 34 distributed in a matrix material 32, wherein the composite particles 34 are fabricated by the preparation method of the embodiments above. As a result, the composite particles 34 can be formed by at least one of the composite particles 20, 20A, 20B, and 20C. Each composite particle 34 is formed by bonding at least one first powder particle 24 and at least one second powder particle 28, wherein each second powder particle 28 is a hollow shell.

In general, the matrix material 32 has a first density, the first powder particles 24 have a second density, and the second density is greater than the first density. When the first powder particles 24 having a greater density are mixed in the matrix material 32 having a smaller density, the first powder particles 24 are readily subsided due to gravitational force (as shown in FIG. 1).

In the present embodiment, second powder particles 28 are provided, wherein the second powder particles 28 have a hollow shell structure, and when the first powder particles 24 and the second powder particles 28 are bonded to form the composite particles 34, the composite particles 34 have a third density. Here, by adjusting the particle size, thin-shell thickness, and quantity of the second powder particles 28, the third density can be about equal to the first density of the matrix material 32 such that the composite particles 34 can be uniformly distributed in the matrix material 32, thus further alleviating the issue of subsidence of the first powder particles 24 in the matrix material 32. The third density of the composite particles 34 is substantially related to the equivalent density after the first powder particles 24 and the second powder particles 28 are bonded.

In an embodiment, the composite particles 34 can be hydrophobic, and the matrix material 32 can be nonpolar or hydrophobic, such that the composite particles 34 can be uniformly distributed in the matrix material 32. Similarly, when the composite particles 34 are hydrophilic, the matrix material is nonpolar or hydrophilic. More specifically, the composite particles 34 have the same polarity as the matrix material 32.

In an embodiment, the matrix material 32 is a colloid material, and the first powder particles 24 include a wavelength conversion material, wherein the matrix material 32 has a first density of 1 $g/cm^3$ to 2.5 $g/cm^3$, and the first powder particles 24 have a second density ranging from 2.5 $g/cm^3$ to 6 $g/cm^3$. To uniformly distribute all of the composite particles 34 in the matrix material 32, the density of the second powder particles 28 can range from 0.01 $g/cm^3$ to 2 $g/cm^3$, the second powder particles 28 can account for 0.5% to 100% in the total (volume) amount of the first powder particles 24 and the second powder particles 28, and the third density of the composite particles 34 ranges from 1 $g/cm^3$ to 1.5 $g/cm^3$. The materials and numeric values above are only exemplary, and are not intended to limit the disclosure. In other embodiments, the first powder particles 24 can be a dye, a pigment, or other particulate materials.

Figure 6:
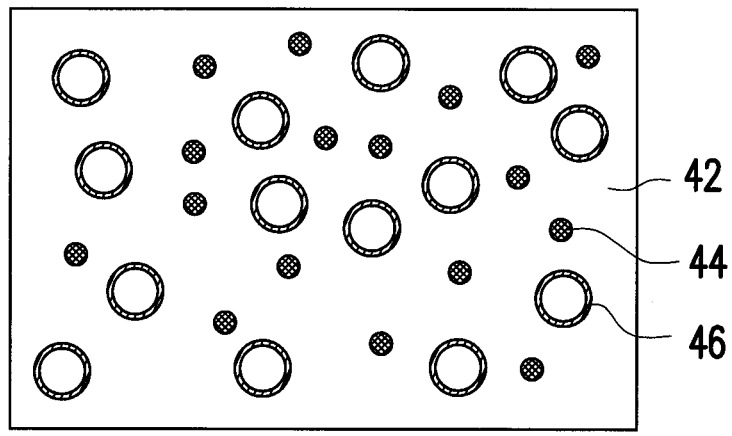
FIG. 6 is a schematic diagram of a composite material according to another embodiment of the disclosure.

FIG. 6 is a schematic diagram of a composite material according to another embodiment of the disclosure. Referring to FIG. 6, a composite material 40 contains a plurality of first powder particles 44 and a plurality of second powder particles 46. The first powder particles 44 and the second powder particles 46 are mixed in a matrix material 42. The matrix material 42 has a first density, the first powder particles 44 have a second density, and the second density is greater than the first density. The second powder particles 46 have a shell-like structure and the second powder particles 46 are substantially hollow shells.

According to the schematic diagram of forces of FIG. 1A, the second density of the first powder particles 44 is greater than the first density of the matrix material 42 such that the first powder particles 44 are readily subsided in the matrix material 42 due to gravitational force. Since the second powder particles 46 have a hollow structure, by adjusting the particle size of the second powder particles 46, the equivalent density thereof can be no greater than that of the matrix material 42 such that the second powder particles 46 are uniformly distributed in the matrix material 42. Therefore, when the first powder particles 44 are subsided in the matrix material 42, the second powder particles 46 can stop the subsidence of the first powder particles 44 such that the first powder particles 44 are suspended in the matrix material 42. In the present embodiment, the material and density of each of the matrix material 42, the first powder particles 44, and the second powder particles 46 are as described in the embodiments above and are not repeated herein.

In the embodiments above, the second powder particles are all exemplified by having hollow structures, but the disclosure is not limited thereto. In other embodiments, a core material can be filled inside the second powder particles, wherein the core material is, for instance, a magnetic material. In the present embodiment, by bonding the second powder particles and the first powder particles, the composite particles can be moved by a magnetic field or an electric field.

Figure 7:
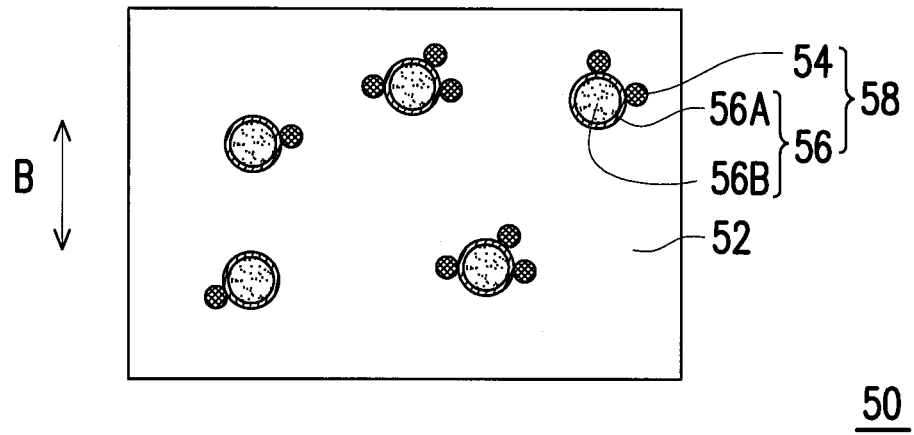
FIG. 7 is a schematic diagram of a composite material according to another embodiment of the disclosure.

FIG. 7 is a schematic diagram of a composite material according to another embodiment of the disclosure. Referring to FIG. 7, a composite material 50 includes a plurality of first powder particles 54 and a plurality of second powder particles 56. The first powder particles 54 and the second powder particles 56 are mixed in a matrix material 52. The matrix material 52 has a first density, the first powder particles 54 have a second density, and the second density is greater than the first density. The second powder particles 56 have a shell-like structure and include a shell 56A and a core material 56B, wherein the core material 56B is filled in the shell 56A. Moreover, at least one first powder particle 54 and at least one second powder particle 56 are bonded together to form a composite particle 58, wherein the at least one first powder particle 54 and the at least one second powder particle 56 can be bonded together by the preparation method of FIG. 2 or FIG. 3A to FIG. 3B.

In the present embodiment, the core material 56B is magnetic. Therefore, the composite particles 58 can be moved in the matrix material 42 by applying a magnetic field B. As a result, by applying the magnetic field B, regardless of whether the density of each of the first powder particles 54 and the second powder particles 56 is less than that of the matrix material 52, the first powder particles 54 and the second powder particles 56 can both be suspended or uniformly distributed in the matrix material 52 and not be subsided on the bottom portion.

Figure 8:
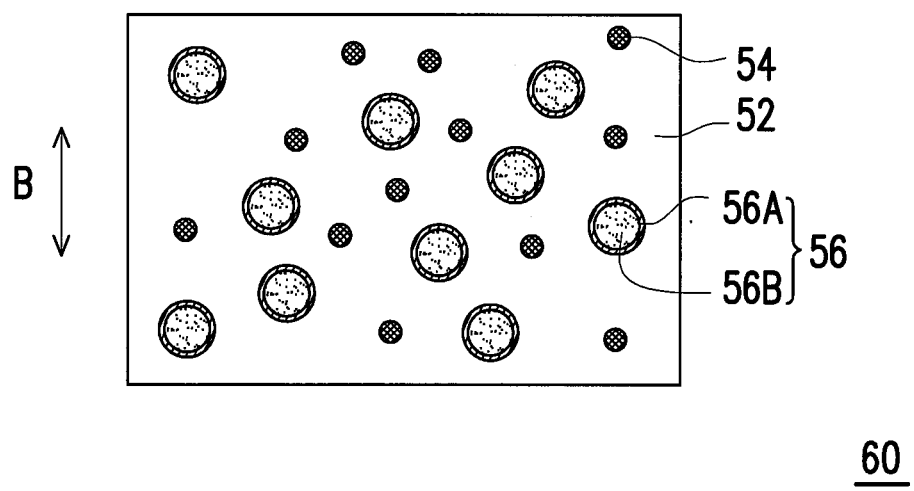
FIG. 8 is a schematic diagram of a composite material according to another embodiment of the disclosure.

FIG. 8 is a schematic diagram of a composite material according to yet another embodiment of the disclosure. Referring to FIG. 8, a composite material 60 includes a plurality of first powder particles 54 and a plurality of second powder particles 56. The first powder particles 54 and the second powder particles 56 are distributed in a matrix material 52. In the present embodiment, the density and properties of each of the matrix material 52, the first powder particles 54, and the second powder particles 56 are as described for FIG. 7 and are not repeated herein. However, the first powder particles 54 and the second powder particles 56 of the present embodiment are respectively distributed in the matrix material 52 and are not bonded together.

In the present embodiment, the core material 56B is magnetic. Therefore, the second powder particles 56 can be moved in the matrix material 52 by applying the magnetic field B. As a result, by applying the magnetic field B, the second powder particles 56 can be suspended in the matrix material 52. In the present embodiment, the first powder particles 54 are stopped by the second powder particles 56 when subsiding, and therefore the first powder particles 54 can be suspended in the matrix material 52. In other words, regardless of whether the gravitational force sustained by the first powder particles 54 and the second powder particles 56 is greater than the sum of the buoyancy force and fluid resistance, by applying the magnetic field B, the first powder particles 54 and the second powder particles 56 can both be suspended in the matrix material 52 and not be subsided on the bottom portion.

Each embodiment above provides a method of preventing powder particles from subsiding in a matrix material. To further describe the disclosure, a light-emitting diode package structure and relevant components thereof are exemplified below to describe the application of the composite particles and the composite material. Of course, the application method below is only exemplary and is not intended to limit the technical field and specific conditions applied in the disclosure.

Figure 9:
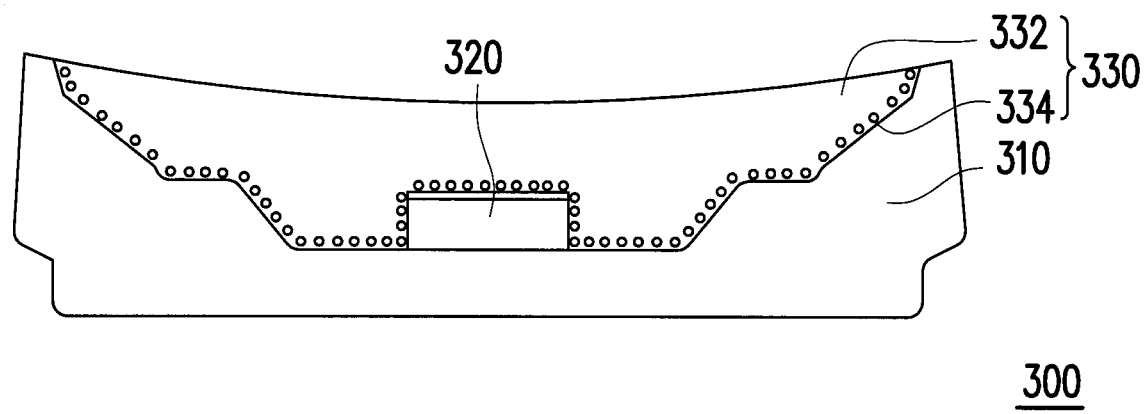
FIG. 9 is a schematic diagram of a conventional light-emitting diode package structure.

FIG. 9 is a schematic diagram of a conventional light-emitting diode package structure. Referring to FIG. 9, a light-emitting diode package structure 300 includes a chip carrier portion 310, a light-emitting diode chip 320, and a package material 330. The light-emitting diode chip 320 is disposed on the chip carrier portion 310, and the package material 330 is filled in the chip carrier portion 310 and covers the light-emitting diode chip 320. The package material 330 includes a matrix material 332 and a plurality of wavelength conversion powder particles 334, wherein the matrix material 332 can be a package colloid. As shown in the figure, the wavelength conversion powder particles 334 are collectively distributed in the bottom portion of the matrix material 332. In other words, the wavelength conversion powder particles 334 are also subsided in the matrix material 332 due to gravitational force, thus causing light rays emitted by a light-emitting diode to not be uniformly distributed.

Figure 10:
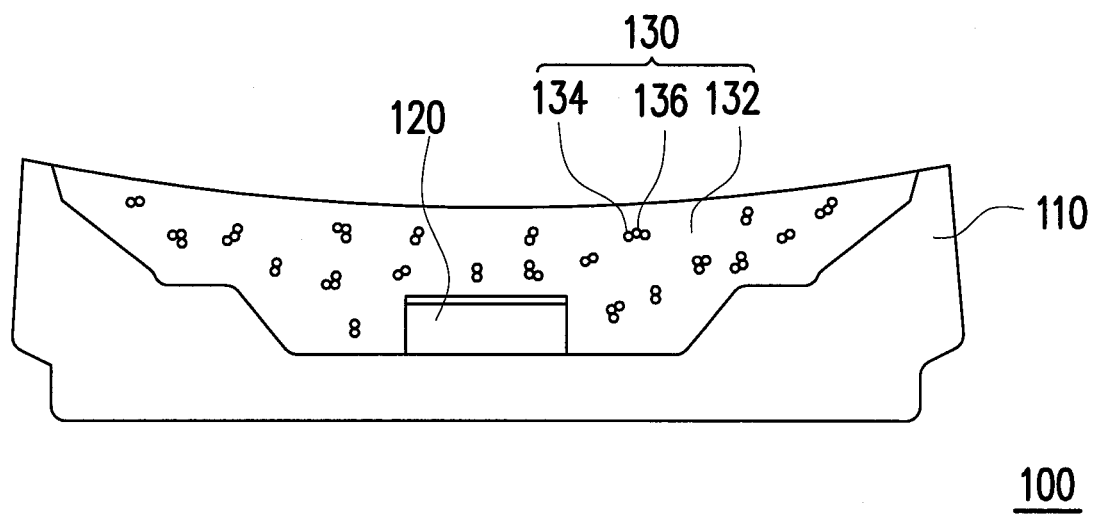
FIG. 10 is a cross-sectional schematic diagram of a light-emitting diode package structure according to the first embodiment of the disclosure.

FIG. 10 is a cross-sectional schematic diagram of a light-emitting diode package structure according to the first embodiment of the disclosure. Referring to FIG. 10, a light-emitting diode package structure 100 includes a chip carrier portion 110, a light-emitting diode chip 120, and a package material 130. The light-emitting diode chip 120 is disposed on the chip carrier portion 110. The package material 130 is filled in the chip carrier portion 110 and covers the light-emitting diode chip 120. The package material 130 includes a matrix material 132, a plurality of first powder particles 134, and a plurality of second powder particles 136. The first powder particles 134 are distributed in the matrix material 132, wherein the first powder particles 134 include a wavelength conversion material. The second powder particles 136 are also distributed in the matrix material 132, wherein the second powder particles 136 have a shell-like structure. Here, the light-emitting diode chip 120 can be disposed on the chip carrier portion 110 by a known method such as a method of flip-chip bonding.

In the present embodiment, the matrix material 132 is a package colloid material and includes epoxy resin, silica gel, or glass. Moreover, the density of the matrix material 132 is about 1 g/cm$^3$ to 2.5 g/cm$^3$ when uncured. The first powder particles 134 include a wavelength conversion material, and the density thereof is about 2.5 g/cm$^3$ to 6 g/cm$^3$, which is greater than the density of the uncured matrix material 132. If the first powder particles 134 are directly added to the uncured matrix material 132, then the first powder particles 134 are readily subsided in the matrix material 132.

Therefore, the package material 130 further includes the second powder particles 136, wherein the second powder particles 136 have a shell-like structure, thus helping to prevent subsidence of the first powder particles 134 in the matrix material 132 during the fabrication process. As a result, the difference in distribution density of the composite particles (formed by the first powder particles 134 and the second powder particles 136 bonded together) distributed in two different regions of the matrix material 132 is less than 15%, and the difference in distribution density can even be 3% or less. The second powder particles 136 can optionally have light scattering or light reflection properties, and can have high transmittance for visible light, such as a light transmittance of greater than 70%, preferably greater than 80%, so as to improve the light extraction efficiency of the light-emitting diode package structure 100. In the present embodiment, the particle size of the second powder particles 136 ranges from 0.01 μM to 100 μm and the second powder particles 136 account for 0.5% to 100% of the total weight of the first powder particles 134 and the second powder particles 136.

As shown in FIG. 10, to reduce the occurrence of or to prevent the first powder particles 134 from subsiding in the matrix material 132, the first powder particles 134 and the second powder particles 136 can first be prepared into composite particles by the above method. Then, the composite particles and the uncured matrix material 132 are mixed to form a composite material, and then the composite material is formed on the light-emitting diode chip 120 through a method such as dispensing, instillation, or coating. Lastly, the composite material is cured to form the package material 130.

In the present embodiment, the second powder particles 136 can be hollow shells as shown in FIG. 5. When the second powder particles 136 are silicon oxide, the density thereof is, for instance, 0.01 g/cm$^3$ to 2 g/cm$^3$. Moreover, the equivalent density of the composite particles formed by bonding the first powder particles 134 and the second powder particles 136 is about 1 g/cm$^3$ to 1.5 g/cm$^3$, which is close to the density of the uncured matrix material 132. As a result, the composite particles can be uniformly distributed in the uncured matrix material 132. The binding agent used for bonding the first powder particles 134 and the second powder particles 136 can have high transmittance for visible light, such as a transmittance of greater than 70%, preferably greater than 80%. In the present embodiment, the index of refraction thereof is substantially close to the index of refraction of the matrix material. For instance, when the matrix material is a package colloid, the index of refraction of the package colloid ranges from 1.4 to 1.6, and the index of refraction of the binding agent can range from 1.0 to 2.0.

In another embodiment, the shell structure of the second powder particles 136 can have a core material, wherein the core material is magnetic, such that a magnetic field can be applied when the composite particles and the uncured matrix material 132 are mixed so as to suspend the composite particles. As a result, the composite particles can be uniformly distributed in the matrix material 132. In the present embodiment, the equivalent density of the composite particles can be not limited to being less than or equal to the density of the uncured matrix material 132.

Moreover, in other embodiments, the first powder particles 134, the second powder particles 136, and the uncured matrix material 132 can also be prepared by the method of FIG. 6 or FIG. 8.

Figure 11:
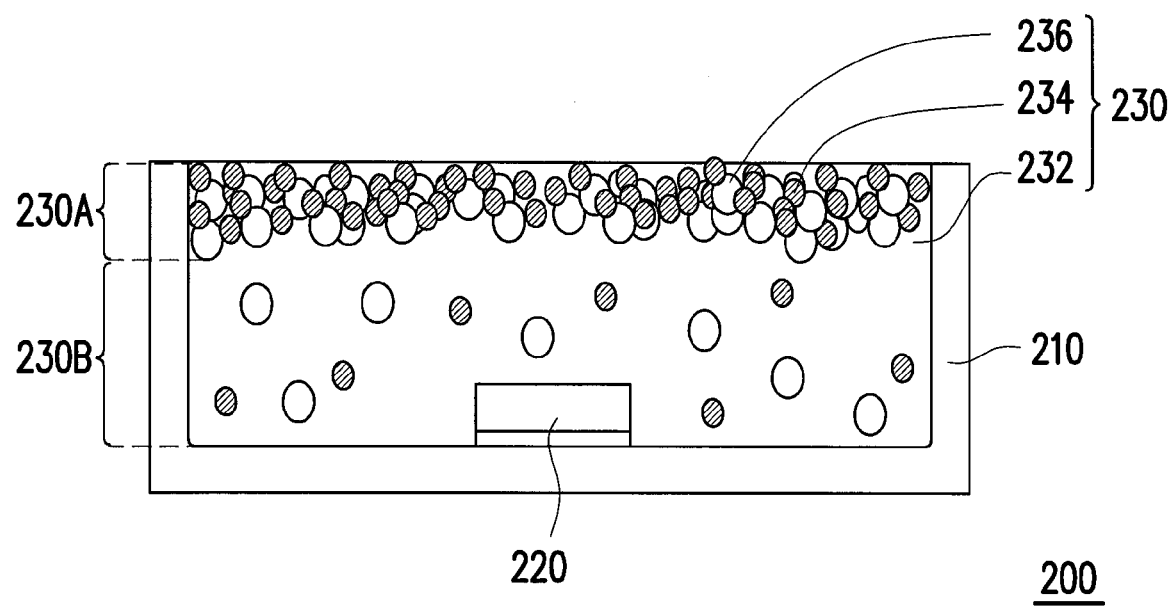
FIG. 11 is a schematic diagram of a light-emitting diode package structure according to the second embodiment of the disclosure.

FIG. 11 is a schematic diagram of a light-emitting diode package structure according to the second embodiment of the disclosure. Referring to FIG. 11, a light-emitting diode package structure 200 includes a chip carrier portion 210, a light-emitting diode chip 220, and a package material 230. The light-emitting diode chip 220 is disposed on the chip carrier portion 210, and the package material 230 is filled in the chip carrier portion 210 and covers the light-emitting diode chip 220. The package material 230 includes a matrix material 232, a plurality of first powder particles 234, and a plurality of second powder particles 236, wherein the matrix material 232 is a package colloid, the first powder particles 234 are distributed in the matrix material 232, and the first powder particles 234 include a wavelength conversion material. The second powder particles 236 are also distributed in the matrix material 232. At the same time, the second powder particles 236 have a shell-like structure.

The difference between the present embodiment and the embodiment of FIG. 10 is that, the package material 230 of the present embodiment has a powder concentrated portion 230A and a powder sparse portion 230B, wherein the powder sparse portion 230B is located between the light-emitting diode chip 220 and the powder concentrated portion 230A. In other words, the distribution density of each of the first powder particles 234 and the second powder particles 236 in the powder concentrated portion 230A is greater than the distribution density thereof in the powder sparse portion 230B. The first powder particles 234 and the second powder particles 236 can be prepared into composite particles by the methods of FIG. 2 and FIG. 3, wherein the equivalent density of the composite particles is less than the density of the matrix material 232 when uncured. Therefore, the composite particles can be suspended on the surface of the uncured matrix material 232 and be collectively distributed in the powder concentrated portion 230A.

Figure 12:
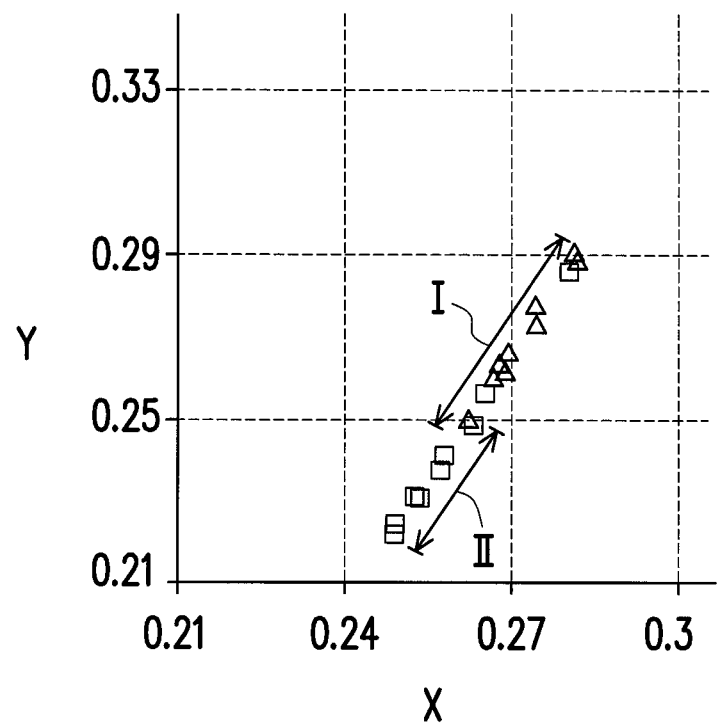
FIG. 12 is a distribution diagram of light emitted by a plurality of conventional light-emitting diode package structures in CIE color coordinates.
Figure 13:
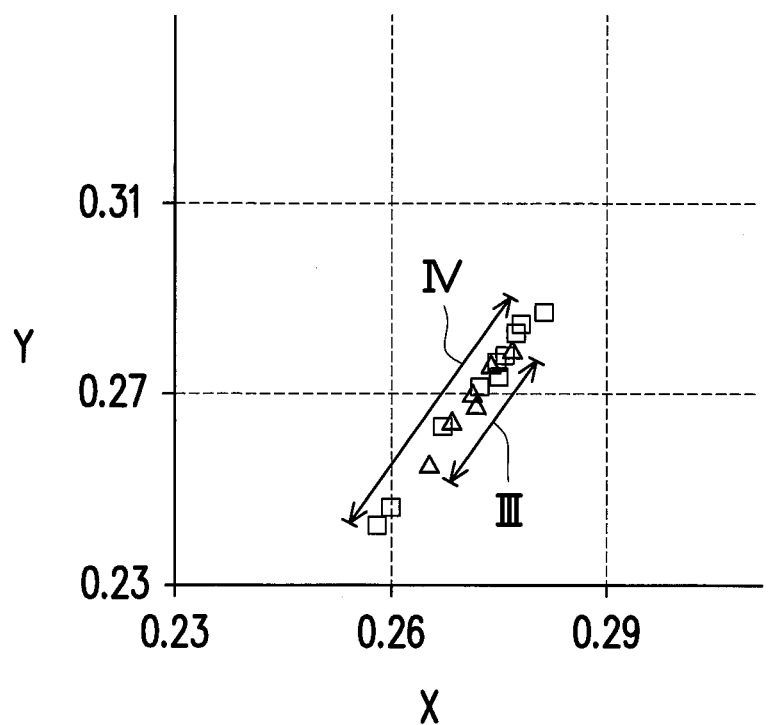
FIG. 13 is a distribution diagram of light emitted by a plurality of light-emitting diode package structures according to the first embodiment of the disclosure in CIE color coordinates.
Figure 14:
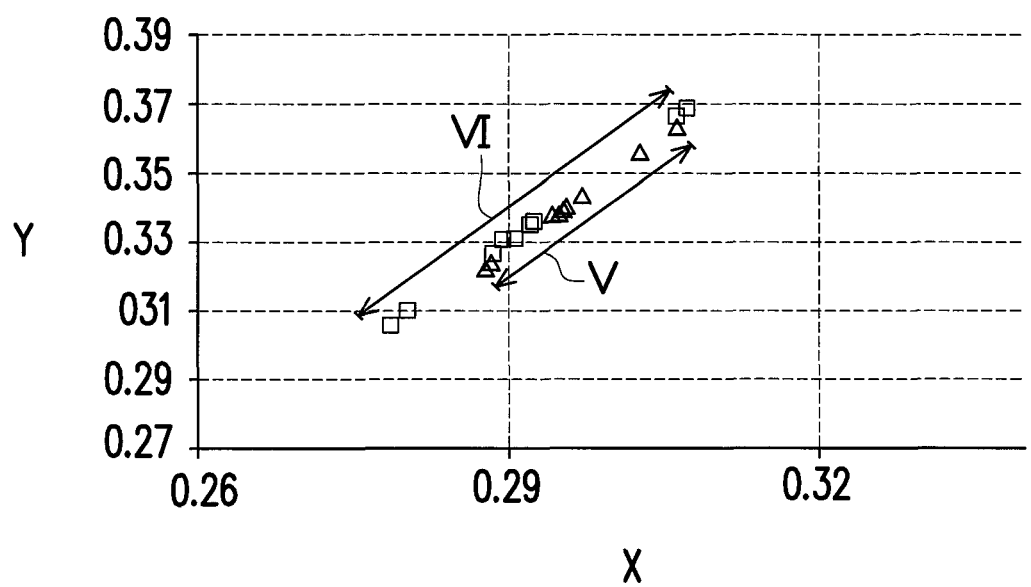
FIG. 14 is a distribution diagram of light emitted by a plurality of light-emitting diode package structures according to another embodiment of the disclosure in CIE color coordinates in which first powder particles and second powder particles are not bonded but are all uniformly distributed in a matrix material.

FIG. 12 is a distribution diagram of light emitted by a plurality of conventional light-emitting diode package structures in CIE (International Commission on Illumination) color coordinates. FIG. 13 is a distribution diagram of light emitted by a plurality of light-emitting diode package structures according to the first embodiment of the disclosure in CIE color coordinates. FIG. 14 is a distribution diagram of light emitted by a plurality of light-emitting diode package structures according to another embodiment of the disclosure in CIE color coordinates in which first powder particles and second powder particles are not bonded but are all uniformly distributed in a matrix material. In FIGS. 12-14, X and Y respectively represent the axes, the triangle symbols represent the positions of light emitted by each light-emitting diode package structure in CIE color coordinates before the matrix material is cured, and the square symbols represent the positions of light emitted by each light-emitting package structure in CIE color coordinates after the matrix material is cured.

It can be known from FIG. 12 that, the distribution of light emitted by a conventional light-emitting diode package structure in CIE color coordinates before and after the matrix material is cured is significantly different. For instance, the distribution in CIE color coordinates is concentrated in region I before the matrix material is cured, and the distribution in CIE color coordinates is concentrated in region II after the matrix material is cured. It can be known from FIG. 13 that, on the other hand, the distribution of light emitted by the light-emitting diode package structure according to the first embodiment of the disclosure in CIE color coordinates is relatively concentrated before and after the matrix material is cured. As shown in the figure, the distribution in CIE color coordinates is concentrated in region III before the matrix material is cured, and the distribution in CIE color coordinates is concentrated in region IV after the matrix material is cured. It can be known from FIG. 14 that, the distribution of light emitted by the light-emitting diode package structure according to another embodiment of the disclosure in CIE color coordinates is relatively concentrated before and after the matrix material is cured. As shown in the figure, the distribution in CIE color coordinates is concentrated in region V before the matrix material is cured, and the distribution in CIE color coordinates is concentrated in region VI after the matrix material is cured. It can be known from the above that, the means of the embodiments of the disclosure for alleviating the issue of subsistence through the disposition of the second powder particles can result in a light-emitting diode package structure having consistent light colors.

In FIG. 12, since the first powder particles are subsided, the color coordinates of light emitted by the light-emitting diode package structure are shifted from region I to region II, thus causing deviation of light colors. Therefore, to make the light emitted by the light-emitting diode package structure be more concentrated in the color coordinates, a colloid material mixed with composite particles can be used for compensation, such that the light colors originally in region II are returned to region I.

Based on the above, the disclosure proposes mixing or bonding first powder particles and second powder particles having a shell-like structure to form composite particles so as to reduce the occurrence of or to prevent the first powder particles from subsiding in a matrix material. The preparation method of the embodiments of the disclosure or the use of the composite material of the embodiments of the disclosure for fabricating the package material of a light-emitting diode package structure helps to increase consistency of light colors of the light-emitting diode package structure.

What is claimed is:

1. A light-emitting diode package structure, comprising:
   a package having a chip carrier portion;
   a light-emitting diode chip disposed on the chip carrier portion of the package; and
   a package material disposed on the chip carrier portion and covering the light-emitting diode chip, wherein the package material comprises:
   a matrix material;
   a plurality of first powder particles distributed in the matrix material, wherein each first powder particle is a wavelength conversion material; and
   a plurality of second powder particles distributed in the matrix material, wherein each second powder particle comprises a shell, and at least one of the first powder particles is bonded to at least one of the second powder particles to form a composite particle.

2. The light-emitting diode package structure of claim 1, wherein the matrix material has a first density when uncured, the composite particle has a second density, and the second density is not greater than the first density.

3. The light-emitting diode package structure of claim 2, wherein a number of the composite particle is a plural, and the composite particles are uniformly distributed in the matrix material such that a difference in distribution density of the composite particles distributed in two different regions of the matrix material is not greater than 15%.

4. The light-emitting diode package structure of claim 2, wherein the package material has a powder concentrated portion and a powder sparse portion, and a distribution density of each of the first powder particles and the second powder particles in the powder concentrated portion is greater than a distribution density of each thereof in the powder sparse portion.

5. The light-emitting diode package structure of claim 1, wherein at least one of the first powder particles is bonded to at least one of the second powder particles through a binding agent.

6. The light-emitting diode package structure of claim 5, wherein a light transmittance of the binding agent is greater than 70%.

7. The light-emitting diode package structure of claim 5, wherein the binding agent covers at least one of the first powder particles and at least one of the second powder particles.

8. The light-emitting diode package structure of claim 5, wherein the composite particle and the matrix material have the same polarity.

9. The light-emitting diode package structure of claim 5, wherein the binding agent comprises silicon oxide, silicate, titanium oxide, zinc oxide, tantalum oxide, aluminum oxide, or a combination thereof.

10. The light-emitting diode package structure of claim 1, wherein a light transmittance of the second powder particles is greater than 70%.

11. The light-emitting diode package structure of claim 1, wherein each second powder particle further comprises a core material filled in the shell.

12. The light-emitting diode package structure of claim 11, wherein the core material is magnetic.

13. The light-emitting diode package structure of claim 1, wherein the shell comprises silicon oxide, aluminum oxide, titanium oxide, chromium oxide, or a combination thereof.

14. The light-emitting diode package structure of claim 1, wherein a particle size of each second powder particle ranges from 0.01 μm to 100 μm.

15. The light-emitting diode package structure of claim 1, wherein the matrix material is a colloid material.

16. The light-emitting diode package structure of claim 1, wherein the second powder particles account for 0.5% to 10% of a total weight of the first powder particles and the second powder particles.

17. The light-emitting diode package structure of claim 1, wherein a density of the second powder particles is not greater than a density of the matrix material when uncured.

18. The light-emitting diode package structure of claim 1, wherein the package material has a powder concentrated portion and a powder sparse portion, the powder sparse portion is located between the light-emitting diode chip and the powder concentrated portion, and a distribution density of each of the first powder particles and the second powder particles in the powder concentrated portion is greater than a distribution density of each thereof in the powder sparse portion.

* * * * *